(12) United States Patent  
Porter et al.

(10) Patent No.: US 8,446,159 B2
(45) Date of Patent: May 21, 2013

(54) CURRENT SENSOR USING LEADFRAME AS SENSING ELEMENT

(75) Inventors: Edson Wayne Porter, Colorado Springs, CO (US); Robert C. Chiacchia, Colorado Springs, CO (US); Wan Wah Loh, Saratoga, CA (US)

(73) Assignee: Linear Technology Corporation, Milpitas, CA (US)

( * ) Notice: Subject to any disclaimer, the term of this patent is extended or adjusted under 35 U.S.C. 154(b) by 383 days.

(21) Appl. No.: 12/827,455

(22) Filed: Jun. 30, 2010

(65) Prior Publication Data

US 2012/0001649 A1    Jan. 5, 2012

(51) Int. Cl.
  *G01R 31/00*    (2006.01)
  *G01R 31/10*    (2006.01)
(52) U.S. Cl.
  USPC ............ 324/750.03; 324/750.06; 324/750.07
(58) Field of Classification Search
  None
  See application file for complete search history.

(56) References Cited

U.S. PATENT DOCUMENTS

| 4,818,895 | A  | * | 4/1989  | Kaufman ...................... 327/565 |
| 5,534,788 | A  | * | 7/1996  | Smith et al. .................... 324/431 |
| 6,150,714 | A  | * | 11/2000 | Andreycak et al. ........... 257/690 |
| 6,225,684 | B1 | * | 5/2001  | Stitt et al. ...................... 257/666 |
| 7,550,806 | B2 | * | 6/2009  | DeBeer et al. ................ 257/379 |

\* cited by examiner

*Primary Examiner* — Vinh Nguyen

(74) *Attorney, Agent, or Firm* — McDermott Will & Emery LLP

(57) ABSTRACT

A current sensor is disclosed. The current sensor includes a leadframe having a die paddle, a portion of the die paddle being configured as a resistive element through which current can flow, and an integrated circuit (IC) die attached and thermally coupled to the die paddle. The IC die includes a current sensing module configured to measure a voltage drop across the resistive element and convert the voltage drop measurement to a current measurement signal and a temperature compensation module electrically coupled to the current sensing module. The temperature compensation module is configured to adjust the current measurement signal to compensate for temperature-dependent changes in the resistive element. The temperature compensation module includes a temperature-sensitive element, with a portion of the temperature-sensitive element located directly over a portion of the resistive element.

20 Claims, 6 Drawing Sheets

CURRENT SENSOR USING LEADFRAME AS SENSING ELEMENT

FIELD

The present disclosure generally relates to integrated circuit (IC) die mounted on leadframes and, more particularly, to current sensing using a portion of the leadframe as the sensing element.

DESCRIPTION OF THE RELATED ART

IC devices have been used to accomplish almost every electronic function in some form or another. The construction of IC devices often uses a leadframe 2 as shown in FIG. 1, wherein the IC die (not shown) is mounted on the die paddle 4 that may be downset from the plane of the connection tabs 6 as shown in FIG. 1. The circuits of the IC die may be connected to the tabs 6 through wirebonded jumper wires (not shown).

Applications such as motor speed control or positioning systems frequently require an IC device to measure the amount of current flowing in a circuit. One method of measuring current is to insert a low-value resistor in the circuit and measure the voltage drop across this resistor. The measured voltage is linearly proportional to the current as long as the resistance value is unchanged. This requires a precision measurement as it is undesirable to dissipate power in the sense resistor and so the resistance value of the sense resistor is typically less than an ohm, leading to a small voltage drop to be measured. One drawback to this approach to measuring current is that the power that is unavoidably dissipated in the sense resistor raises the temperature of the sense resistor and this temperature change will cause a change in the value of the resistor.

An example design is shown in FIG. 2 (from U.S. Pat. No. 6,150,714) where a sense resistor 26 has been formed as part of the leadframe 10 adjacent to IC die 12 which is mounted on die paddle 14. Two jumper wires 30 connect pads 32 on IC die 12 to the terminals 28 of sense resistor 26. In this example, current flows from external leads 1, 2, and 3 through the left conductive element 24 through resistor 26 and then through the right conductive element 24 and out external leads 14, 15, and 16. The voltage drop across resistor 26 is measured by circuits on IC die 12 through the leads 30 connected to terminals 28.

Temperature compensation circuits are sometimes used to improve the accuracy of the current measurement. These circuits may include one or more temperature-sensitive elements that can be used to generate a compensation signal that, when combined with the measurement taken from the resistor, provides a more accurate measurement. It can be seen that, in the example shown in FIG. 2, that resistor 26 is physically separated from the IC die 12. Any temperature compensation circuits that are located on IC die 12 may be at a different temperature that the resistor 26 as the thermal path linking the resistor 26 to IC die 12 is through the plastic package 22. This separation of the temperature compensation circuit from the sense resistor 26 reduces the accuracy of the compensation.

SUMMARY

There is a need for a current sensor that accurately compensates for the temperature-related changes in the current sensing element in IC devices.

In certain embodiments, a current sensor is disclosed. The current sensor includes a leadframe having a die paddle, a portion of the die paddle being configured as a resistive element through which current can flow, and an integrated circuit (IC) die attached and thermally coupled to the die paddle. The IC die comprises a current sensing module that is configured to measure a voltage drop across the resistive element and convert the voltage drop measurement to a current measurement signal and a temperature compensation module that is electrically coupled to the current sensing module. The temperature compensation module is configured to adjust the current measurement signal to compensate for temperature-dependent changes in the resistive element. The temperature compensation module includes a temperature-sensitive element, a portion of the temperature-sensitive element located directly over a portion of the resistive element.

In certain embodiments, an IC package is disclosed. The IC package comprises a housing, a leadframe having a die paddle, a portion of the die paddle being configured as a resistive element through which current can flow. The leadframe is attached within the housing and an IC die is attached and thermally coupled to the die paddle. The IC die comprises a current sensing module configured to measure a voltage drop across the resistive element and convert the voltage drop measurement to a current measurement signal and a temperature compensation module electrically coupled to the current sensing module. The temperature compensation module is configured to adjust the current measurement signal to compensate for temperature-dependent changes in the resistive element. The temperature compensation module is located directly over a portion of the resistive element.

In certain embodiments, a method of measuring current is disclosed. The method of measuring current comprises the steps of attaching an IC die to a leadframe having a portion configured as a resistive element through which current can flow, the IC die comprising a temperature compensation module having an output, the temperature compensation module configured to compensate for temperature-related changes in the resistive element to the leadframe, the IC die attached such that the temperature compensation module is positioned directly over a portion of the resistive element of the leadframe, connecting the resistive element such that the resistive element forms a part of the path of the current to be measured; measuring the voltage drop across the resistive element, converting the voltage drop measurement into a current measurement signal, and adjusting the current measurement signal based at least in part upon the output of the temperature compensation module.

BRIEF DESCRIPTION OF THE DRAWINGS

The accompanying drawings, which are included to provide further understanding and are incorporated in and constitute a part of this specification, illustrate disclosed embodiments and together with the description serve to explain the principles of the disclosed embodiments. In the drawings.

DETAILED DESCRIPTION

The current sensor disclosed herein provides the capability to measure current while compensating for temperature-related changes in the sense resistor.

In the following detailed description, numerous specific details are set forth to provide a full understanding of the present disclosure. It will be apparent, however, to one ordinarily skilled in the art that embodiments of the present disclosure may be practiced without some of the specific details. In other instances, well-known structures and techniques have not been shown in detail so as not to obscure the disclosure.

Figure 1:
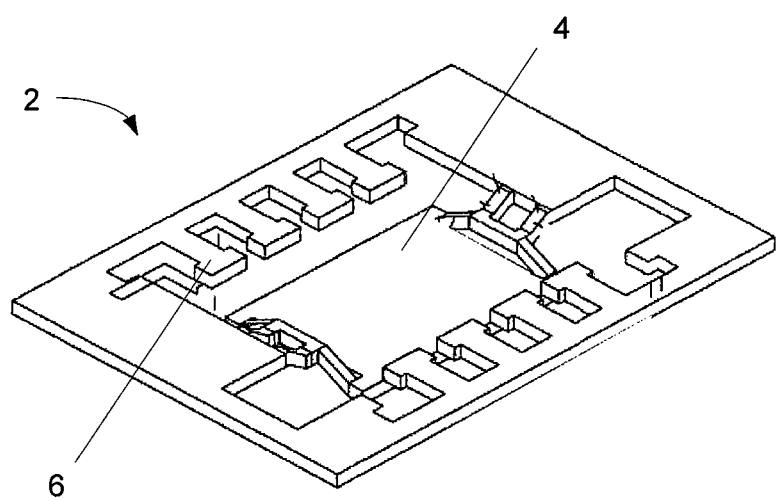
FIG. 1 is a perspective view of a leadframe having a downset die paddle.
Figure 2:
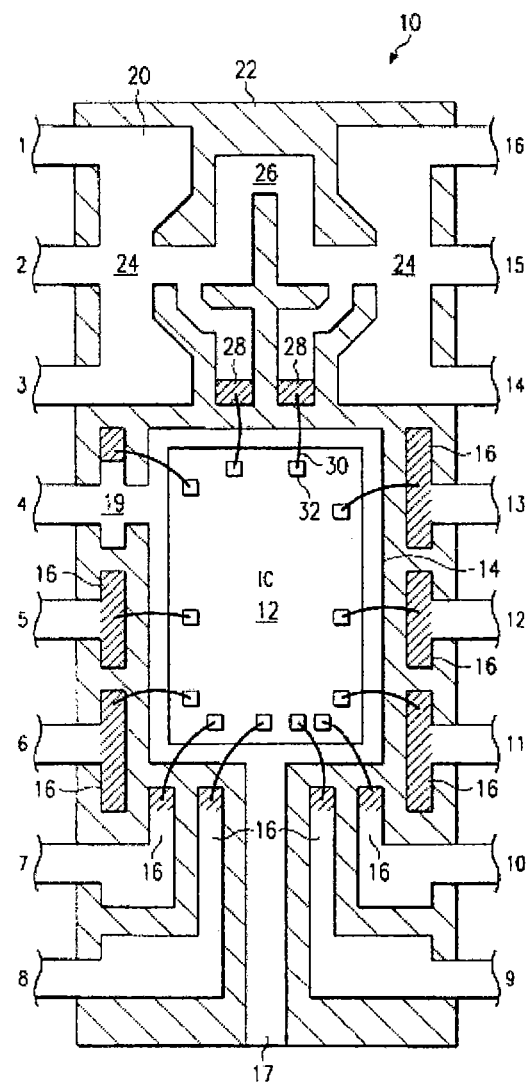
FIG. 2 is plan view of an IC die mounted on a leadframe where a portion of the leadframe forms a sense resistor.
Figure 3:
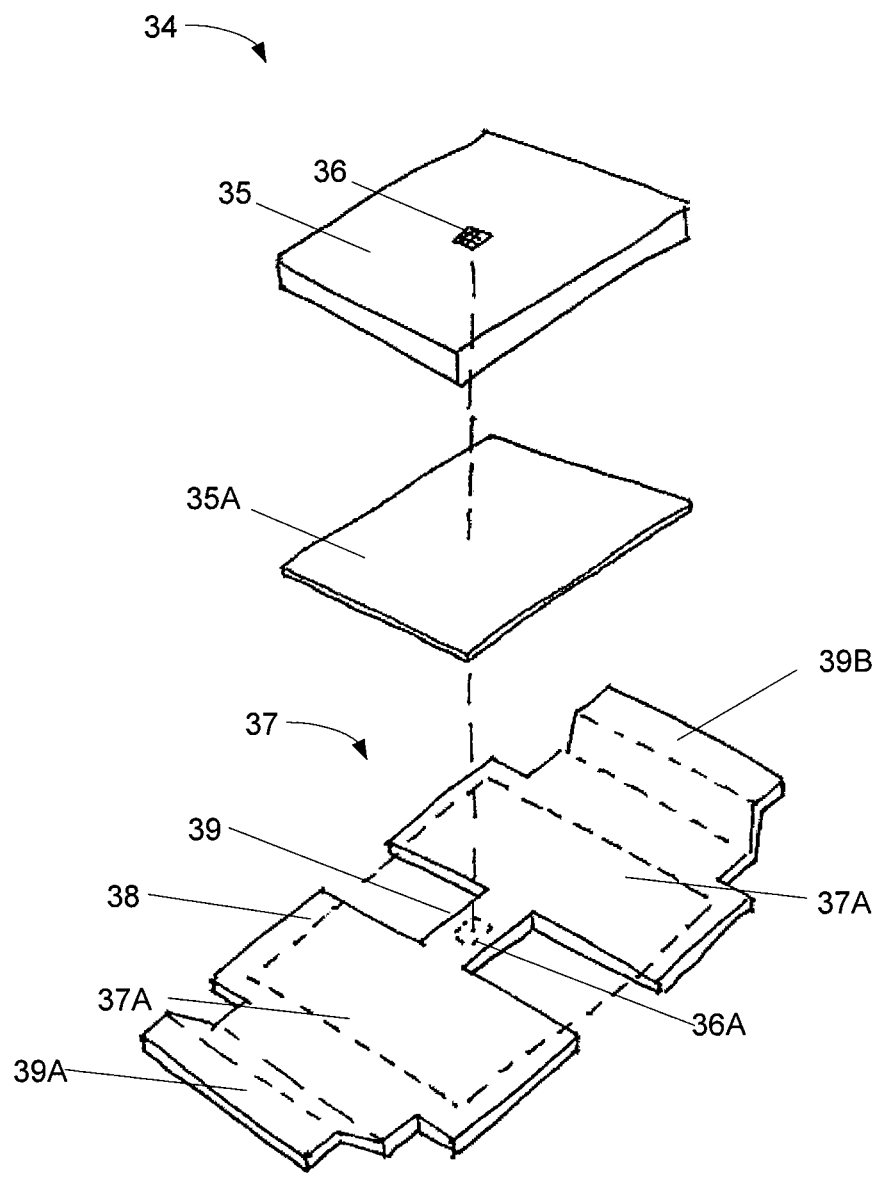
FIG. 3 is a separated perspective view of an embodiment of a leadframe current sensor according to certain aspects of the present disclosure.

FIG. 3 is a separated perspective view of an embodiment of a leadframe current sensor 34 according to certain aspects of the present disclosure. The current sensor 34 includes an IC die 35 that comprises temperature compensation module 36. IC die 35 is mounted to a die paddle 37 in the area shown by dotted line 38. IC die 35 is attached to die paddle 37, in this example, with an adhesive film 35A that provides mechanical adhesion as well as electrical isolation between IC die 35 and die paddle 37. In this embodiment, a resistive element 39 is formed in the die paddle 37. This adhesive film 35A may be a separate sheet of adhesive or a coating applied to the underside of die 35 prior to die segmentation. Current flows from pad 39A to 39B, in this example, and the voltage drop over the large pads 37A will be negligible compared to the voltage drop across resistive element 39. This resistive element 39 is directly under the temperature compensation module 36 as indicated by the outline 36A which indicates the region of die paddle 37 overlaid by temperature compensation module 36 when assembled.

In certain embodiments, the physical size of the complete temperature compensation module 36 may be larger than the area of resistive element 39 and only a portion of temperature compensation module 36 may be directly over resistive element 39. In certain configurations, temperature compensation module 36 may comprise an element that is temperature sensitive and provides the temperature input to the temperature compensation module 36 with an additional element that is not temperature sensitive, such as a digital circuit. The portion of the temperature compensation module 36 that is not temperature sensitive may be located on a portion of the IC die 35 away from the location that is over resistive element 39 without adverse impact to the accuracy of the temperature compensation as long as the temperature-sensitive portion of the circuit, or a portion thereof, is located over resistive element 39.

For a planar object such as the die paddle 37, use of descriptive words such as "above", "over", and "under" are relative to the displacement of an object along an axis perpendicular to the plane of the die paddle 37 where the die paddle is considered to be "horizontal". This terminology is used as a convenient way of indicating relative positions and does not imply a defined orientation relative to a gravitational frame of reference.

This co-location of the current sensing element 39 and the temperature compensation module 36, when the IC die 35 is mounted to the die paddle 37, provides excellent thermal coupling between the current sensing element 39 and temperature compensation module 36. In addition, current sensing element 39 is also thermally connected to the large pads 37A on both sides and tend to be at the same temperature as pads 37A. Heat generated in the current sense element 39 will be conducted into both pads 37A and over the large bonded areas into the IC die 35. This will reduce the temperature differential between the IC die 35 and the die paddle 37. As a result, the temperature of the temperature compensation module 36 will be very close to that of current sensing element 39 which improves the compensation accuracy.

Figure 4:
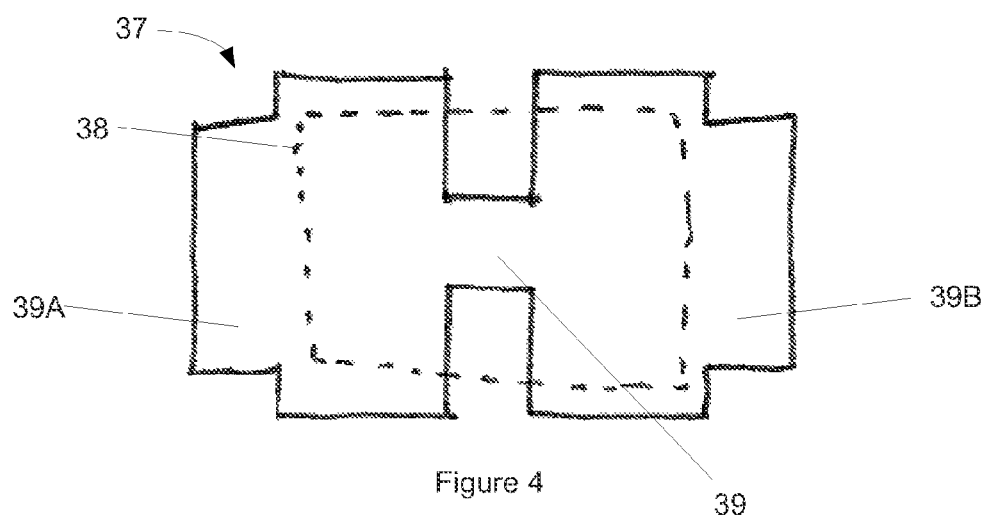
FIGS. 4-6 are plan views of embodiments of a die paddle incorporating a current sense element according to certain aspects of the present disclosure.
Figure 5:
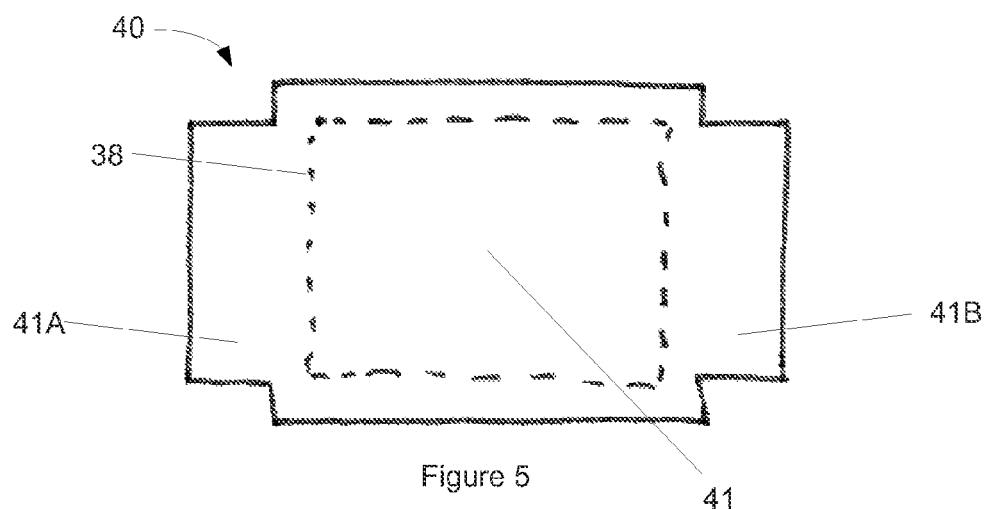
Figure 6:
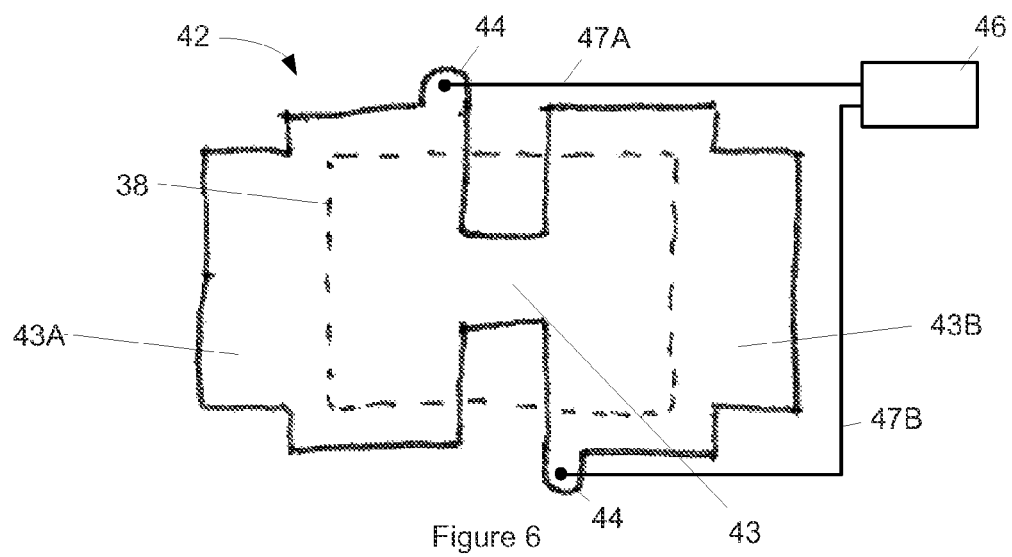

FIGS. 4-6 are plan views of embodiments of a die paddle incorporating a current sense element 46 according to certain aspects of the present disclosure. FIG. 4 is the same die paddle 37 as shown in FIG. 3, where the area covered by the IC die (not shown is indicated by outline 38 and the area of reduced cross-section 39 forms the resistive element. Alternate embodiments of resistive element 39 may include multiple parallel elements in place of the single element 39 shown in FIG. 4 or positioning resistive element 39 away from the center location shown in FIG. 4. FIG. 5 is an alternate embodiment where the entire die paddle 40 forms the sense resistor, Current flows from area 41A to 41B, and the voltage drop can be measured in these same areas 41A and 41B. FIG. 6 shows a die paddle 42 configured with tabs 44 and having a reduced cross-section resistive element 43, Current flows from 43A through resistive element 43 to 43B. The voltage drop across resistive element 43 can be measured by connecting a current sense element 46 to tabs 44 using voltage measurement lines 47A and 47B and measuring the voltage drop across tabs 44 as the voltage drop across the large pad between each tab 44 and the near side of resistive element 43 is negligible. The current sense element 46 converts the voltage drop measurement to a current measurement signal using the previously determined resistance of the resistive element 43. This type of measurement of a voltage drop in a circuit is known as a "Kelvin method" or "4-terminal sensing" measurement of impedance. As no current flows through the voltage measurement lines 47A, 47B, presuming that they are connected to a high-impedance input in the current sense element 46, there is no voltage drop in the voltage measurement lines 47A, 47B regardless of the length of the voltage measurement lines 47A. 47B.

Figure 7:
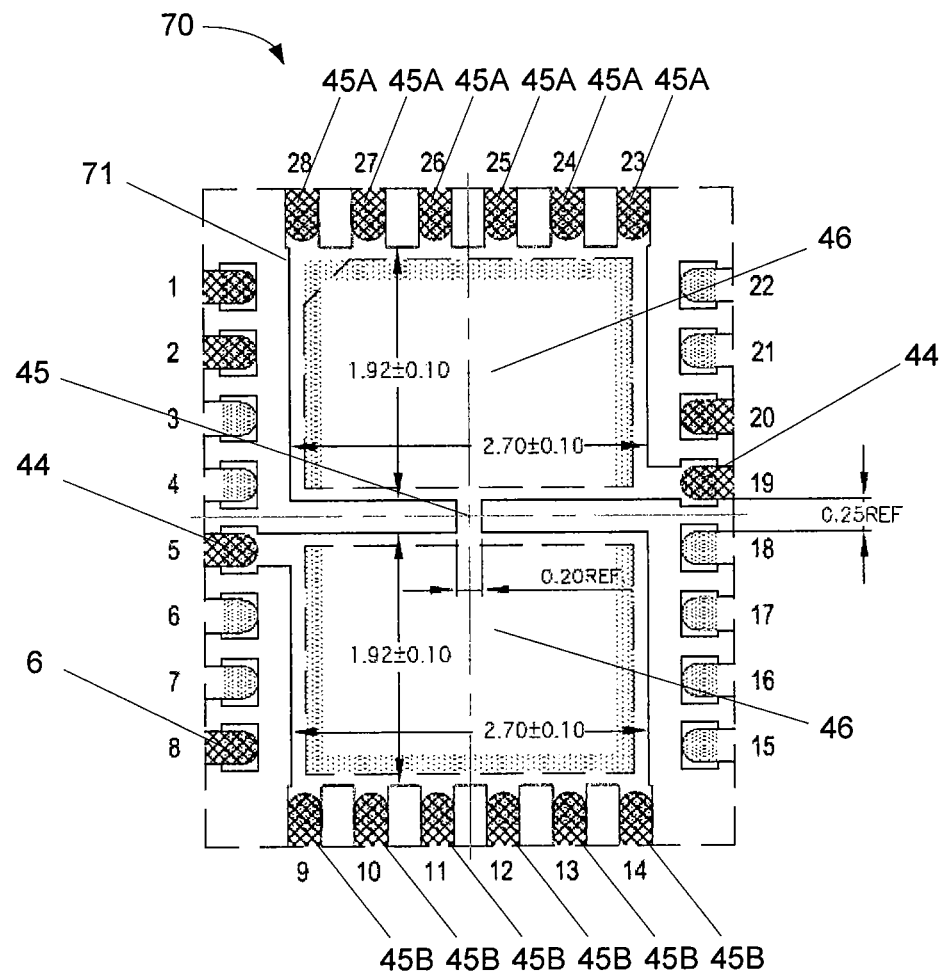
FIG. 7 is a plan view of the underside of an exemplary embodiment of a leadframe incorporating a current sense element according to certain aspects of the present disclosure.

FIG. 7 is a plan view of the underside of an exemplary embodiment of a leadframe 70 incorporating a current sense element 45 according to certain aspects of the present disclosure. In this view, the connection tabs 6 are visible surrounding the die paddle 71. Pads 45A and 45B will be connection points for the external circuit in which the IC will measure current as the current flows between 45A and 45B. The use of multiple pins for this connection allows a higher current and enables easier inspection of the solder connections to pads 45A and 45B. Connection tabs 44 will be the contact points for bond wires (not shown) or other electrical connection between the die paddle and the current sensing module (not shown) configured to take a Kelvin method measurement of the voltage drop across current sense element 45. In this embodiment, the cross-section of resistive element 45 has been reduced in thickness as well as in width (perpendicular to the current flow) compared to the thickness and width of the areas 46 which make up most of the die paddle on either side of resistive element 45.

Figure 8:
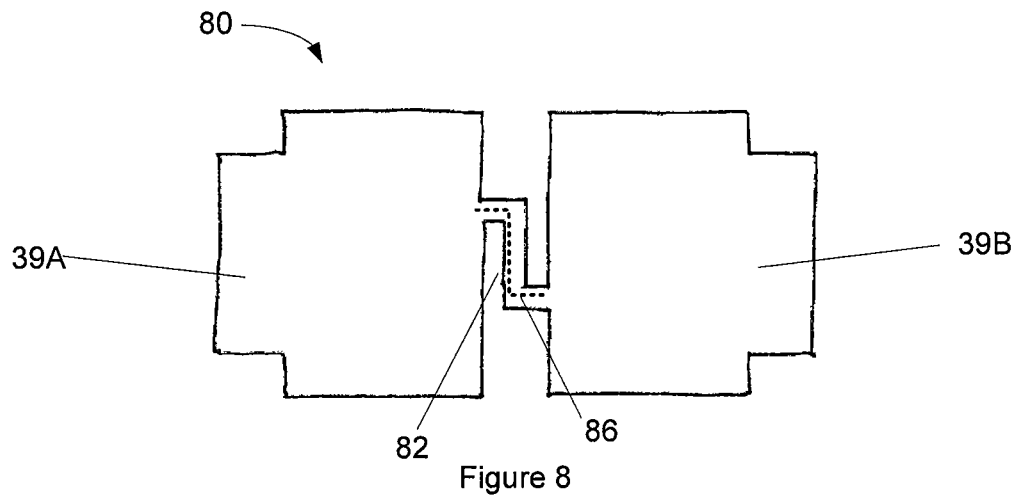
FIGS. 8-10 are plan views of alternate embodiments of a leadframe incorporating a current sense element according to certain aspects of the present disclosure.
Figure 9:
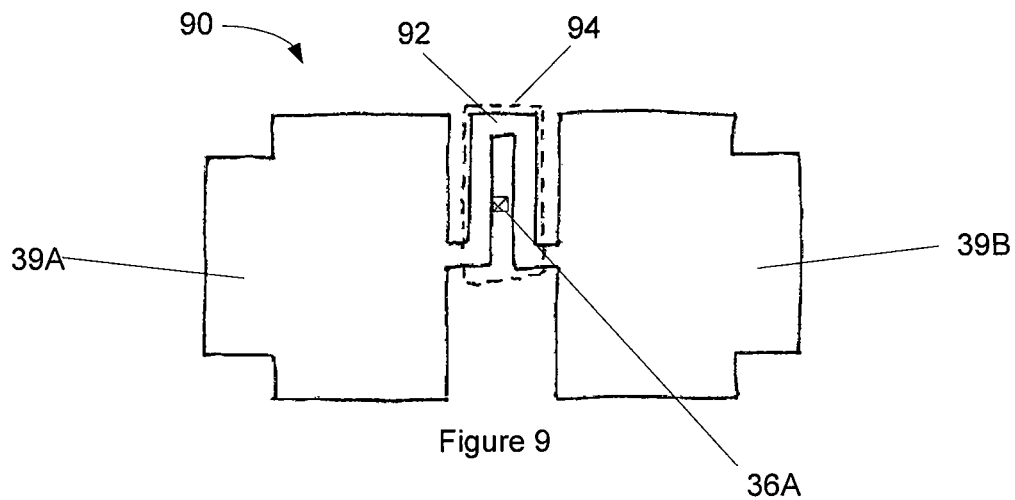
Figure 10:
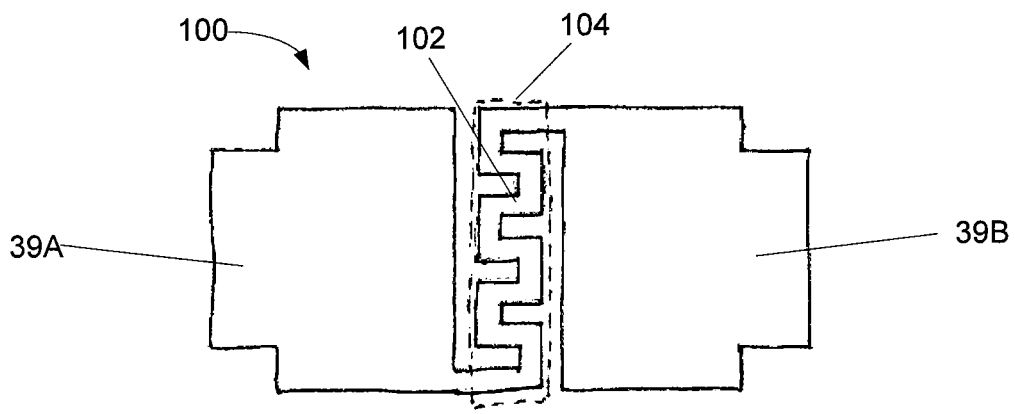

FIG. 8-10 are plan views of alternate embodiments of a leadframe incorporating a current sense element according to certain aspects of the present disclosure. FIG. 8 shows a die paddle 80 with a resistive element 82 that is longer along the centerline path of current flow, which is indicated by the dotted line 86, than the resistive element 82 is wide. This configuration of resistive element 82 may be used to increase the resistance for lower current applications. FIG. 9 is an alternate embodiment wherein die paddle 90 has a resistive element 92 that follows a path that is not centered in the die paddle 90. The convoluted path of resistive element 92 is bounded by a perimeter 94. In this example, the projected location 36A of the temperature sensing module is within the area bounded by perimeter 94 but is not directly over the resistive element 92. This configuration provides the same benefit as having the temperature sensing module directly over the resistive element 92 as the resistive element 92 is thermally coupled to the temperature compensation module (not shown) over the entire area bounded by perimeter 94. FIG. 10 shows another embodiment in which die paddle 100 has a long, serpentine resistive element 102 bounded by perimeter 104.

In summary, the disclosed embodiments of the stacked leadframe assembly provide improved thermal coupling between a current sense resistor that is formed in the die paddle of the leadframe and a temperature compensation module that is located on the IC die that is attached to the die paddle. This is accomplished by the location of the temperature compensation module directly over the resistive element or, in the case of a convoluted resistive element, within the area of the resistive element. Having the temperature compensation module at a temperature very close to that of the resistive element enables accurate compensation in the current measurement signal for the temperature-dependent changes in the resistive element that affect the current measurement.

The previous description is provided to enable any person skilled in the art to practice the various aspects described herein. While the foregoing has described what are considered to be the best mode and/or other examples, it is understood that various modifications to these aspects will be readily apparent to those skilled in the art, and the generic principles defined herein may be applied to other aspects. Thus, the claims are not intended to be limited to the aspects shown herein, but is to be accorded the full scope consistent with the language claims, wherein reference to an element in the singular is not intended to mean "one and only one" unless specifically so stated, but rather "one or more." Unless specifically stated otherwise, the term "some" refers to one or more. Pronouns in the masculine (e.g., his) include the feminine and neuter gender (e.g., her and its) and vice versa. Headings and subheadings, if any, are used for convenience only and do not limit the invention.

It is understood that the specific order or hierarchy of steps in the processes disclosed is an illustration of exemplary approaches. Based upon design preferences, it is understood that the specific order or hierarchy of steps in the processes may be rearranged. Some of the steps may be performed simultaneously. The accompanying method claims present elements of the various steps in a sample order, and are not meant to be limited to the specific order or hierarchy presented.

Terms such as "top," "bottom," "front," "rear" and the like as used in this disclosure should be understood as referring to an arbitrary frame of reference, rather than to the ordinary gravitational frame of reference. Thus, a top surface, a bottom surface, a front surface, and a rear surface may extend upwardly, downwardly, diagonally, or horizontally in a gravitational frame of reference.

A phrase such as an "aspect" does not imply that such aspect is essential to the subject technology or that such aspect applies to all configurations of the subject technology. A disclosure relating to an aspect may apply to all configurations, or one or more configurations. A phrase such as an aspect may refer to one or more aspects and vice versa. A phrase such as an "embodiment" does not imply that such embodiment is essential to the subject technology or that such embodiment applies to all configurations of the subject technology. A disclosure relating to an embodiment may apply to all embodiments, or one or more embodiments. A phrase such an embodiment may refer to one or more embodiments and vice versa.

The word "exemplary" is used herein to mean "serving as an example or illustration." Any aspect or design described herein as "exemplary" is not necessarily to be construed as preferred or advantageous over other aspects or designs.

All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. §112, sixth paragraph, unless the element is expressly recited using the phrase "means for" or, in the case of a method claim, the element is recited using the phrase "step for." Furthermore, to the extent that the term "include," "have," or the like is used in the description or the claims, such term is intended to be inclusive in a manner similar to the term "comprise" as "comprise" is interpreted when employed as a transitional word in a claim.

What is claimed is:

1. A current sensor comprising:
   a leadframe having a die paddle, a portion of the die paddle configured as a resistive element through which current can flow; and
   an integrated circuit (IC) die attached and thermally coupled to the die paddle, the IC die comprising:
      a current sensing module configured to measure a voltage drop across the resistive element and convert the voltage drop measurement to a current measurement signal; and
      a temperature compensation module electrically coupled to the current sensing module, the temperature compensation module configured to adjust the current measurement signal to compensate for temperature-dependent changes in the resistive element, the temperature compensation module including a temperature-sensitive element, a portion of the temperature-sensitive element located directly over a portion of the resistive element.

2. The current sensor of claim 1 wherein the current sensing module is configured to make a Kelvin method measurement of the voltage drop across the resistive element.

3. The current sensor of claim 1 wherein resistive element comprises the entire die paddle.

4. The current sensor of claim 1 wherein the resistive element has a reduced cross-section compared to the cross section of the die paddle on either side of the resistive element, wherein the cross-sections are perpendicular to the direction of current flow.

5. The current sensor of claim 4 wherein the resistive element is longer along the centerline path of the current flow than the average width of the resistive element perpendicular to the current flow.

6. The current sensor of claim 5 wherein the resistive element is bounded by a generally rectilinear perimeter, and wherein the temperature compensation module is located over a portion of an area bounded by the perimeter.

7. The current sensor of claim 1 wherein the resistive element is in thermal contact with the die directly under the temperature compensation module.

8. The current sensor of claim 1 wherein the entire area of the temperature compensation module is over the resistive element.

9. An IC package comprising:
a housing;
a leadframe having a die paddle, a portion of the die paddle configured as a resistive element through which current can flow, the leadframe attached to the housing; and
an IC die attached and thermally coupled to the die paddle, the IC die comprising:
a current sensing module configured to measure a voltage drop across the resistive element and convert the voltage drop measurement to a current measurement signal; and
a temperature compensation module electrically coupled to the current sensing module, the temperature compensation module configured to adjust the current measurement signal to compensate for temperature-dependent changes in the resistive element, the temperature compensation module including a temperature-sensitive element, a portion of the temperature-sensitive element located directly over a portion of the resistive element.

10. The current sensor of claim 9 wherein the current sensing module is configured to make a Kelvin method measurement of the voltage drop across the resistive element.

11. The current sensor of claim 9 wherein resistive element comprises the entire die paddle.

12. The current sensor of claim 9 wherein the resistive element has a reduced cross-section compared to the cross section of the die paddle on either side of the resistive element, where the cross-sections are perpendicular to the direction of current flow.

13. The current sensor of claim 12 wherein the resistive element is longer along the centerline path of the current flow than the average width of the resistive element perpendicular to the current flow.

14. The current sensor of claim 13 wherein the resistive element is bounded by a generally rectilinear perimeter, and wherein the temperature compensation module is located over a portion of an area bounded by the perimeter.

15. The current sensor of claim 9 wherein the resistive element is in thermal contact with the die directly under the temperature compensation module.

16. The current sensor of claim 9 wherein the entire area of the temperature compensation module is over the resistive element.

17. The IC package of claim 9 wherein a portion of the leadframe is exposed through the housing.

18. A method of measuring current comprising the steps of:
attaching an IC die to a leadframe having a portion configured as a resistive element through which current can flow, the IC die comprising a temperature compensation module having an output and a temperature-sensitive element, the temperature compensation module configured to compensate for temperature-related changes in the resistive element to the leadframe, the IC die attached such that a portion of the temperature-sensitive element of the temperature compensation module is positioned directly over a portion of the resistive element of the leadframe;
connecting the resistive element such that the resistive element forms a part of the path of the current to be measured;
measuring the voltage drop across the resistive element;
converting the voltage drop measurement into a current measurement signal; and
adjusting the current measurement signal based at least in part upon the output of the temperature compensation module.

19. The method of claim 18 wherein the step of measuring the voltage drop comprises making a Kelvin method measurement of the voltage drop across the resistive element.

20. The method of claim 18 wherein the step of attaching an IC die comprises locating the IC die such that the entire area of the temperature compensation module is over the resistive element.

* * * * *